(12) United States Patent
Brockett et al.

(10) Patent No.: US 6,265,756 B1
(45) Date of Patent: Jul. 24, 2001

(54) ELECTROSTATIC DISCHARGE PROTECTION DEVICE

(75) Inventors: Steven W. Brockett, Portland; Wesley C. Mickanin; Steven D. Bingham, both of Beaverton; Dennis A. Criss, Hillsboro, all of OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 09/295,467

(22) Filed: Apr. 19, 1999

(51) Int. Cl.$^7$ .......................... H01L 27/148; H01L 23/62
(52) U.S. Cl. .......................... 257/555; 257/355; 257/357; 257/173; 257/678; 257/360
(58) Field of Search .................................. 257/659, 360, 257/555, 355, 379, 382, 472, 363, 476; 361/91, 56

(56) References Cited

U.S. PATENT DOCUMENTS

| 3,912,546 | 10/1975 | Hunsperger et al. | 148/1.5 |
| 4,803,527 | 2/1989 | Hatta et al. | 357/13 |
| 4,930,036 * | 5/1990 | Stich | 361/56 |
| 5,023,672 * | 6/1991 | Paquette et al. | 257/472 |
| 5,185,654 * | 2/1993 | Mosher et al. | 257/659 |
| 5,374,569 | 12/1994 | Yilmaz et al. | 437/34 |
| 5,416,039 | 5/1995 | Yilmaz et al. | 437/59 |
| 5,422,508 | 6/1995 | Yilmaz et al. | 257/370 |
| 5,426,328 | 6/1995 | Yilmaz et al. | 257/552 |
| 5,537,284 * | 7/1996 | Haas, Jr. et al. | 361/56 |
| 5,559,044 | 9/1996 | Williams et al. | 437/34 |
| 5,654,574 * | 8/1997 | Williams et al. | 257/360 |
| 5,689,132 * | 11/1997 | Ichikawa | 257/360 |
| 5,767,552 * | 6/1998 | Casper et al. | 257/379 |
| 5,920,096 * | 7/1999 | Lee | 257/355 |

FOREIGN PATENT DOCUMENTS

| 0 422 676 | 4/1991 | (EP) | H01L/27/02 |
| 2 014 363 | 8/1979 | (GB) | H01L/21/263 |
| 56-058226 | 5/1981 | (JP) | H01L/21/22 |

* cited by examiner

Primary Examiner—Matthew Smith
Assistant Examiner—Igwe U. Anya
(74) Attorney, Agent, or Firm—Skjerven Morrill MacPherson LLP; Brian D. Ogonowsky; Daniel P. Stewart

(57) ABSTRACT

An electrostatic discharge protection device for reducing electrostatic discharge spikes on a signal line is disclosed. The electrostatic discharge protection device includes first and second contact regions formed in a semiconductor material such as a compound semiconductor substrate. A first terminal is electrically coupled between the signal line and the first contact region. A second terminal is electrically coupled between the second contact region and a sink such as ground. An isolation region is formed in the semiconductor material between the first and second contact regions. The isolation region may be an implant-damaged region of the semiconductor material. The electrostatic discharge protection device provides protection against electrostatic discharges for integrated circuit components, while adding only a small amount of parasitic capacitance to I/O lines, which is particularly important in RF signal processing circuitry.

16 Claims, 4 Drawing Sheets

ELECTROSTATIC DISCHARGE PROTECTION DEVICE

TECHNICAL FIELD OF THE INVENTION

The present invention relates to integrated circuits, and in particular to an electrostatic discharge protection device.

BACKGROUND OF THE INVENTION

The potential for electrostatic discharge to cause damage to integrated circuits is well known. Electrostatic discharge may occur at various stages in the assembly and testing of a chip package, and may be generated by a variety of sources. To prevent damage to the chip, electrostatic discharge (ESD) protection devices must be built into the chip to dissipate ESD voltage/current spikes.

Existing ESD protection devices typically comprise a shunt connected between each input/output (I/O) line and ground and/or a power supply. These devices frequently contribute an undesirable level of parasitic capacitance to the I/O lines. This capacitance can adversely affect circuit performance, particularly in the field of radio frequency (RF) circuits.

SUMMARY OF THE INVENTION

Therefore, a need has arisen for an electrostatic discharge protection device that addresses the disadvantages and deficiencies of the prior art. In particular, a need has arisen for an electrostatic discharge protection device with reduced parasitic capacitance.

Accordingly, an electrostatic discharge protection device for reducing electrostatic discharge spikes on a signal line is disclosed. In one embodiment, the electrostatic discharge protection device includes first and second contact regions formed in a semiconductor material such as a compound semiconductor substrate. A first terminal is electrically coupled between the signal line and the first contact region. A second terminal is electrically coupled between the second contact region and a sink such as ground. An isolation region is formed in the semiconductor material between the first and second contact regions. In one embodiment, the isolation region is an implant-damaged region of the semiconductor material.

In another aspect of the present invention, a method for fabricating an electrostatic discharge protection device is provided. The method entails forming first and second contact regions in a semiconductor material, forming an isolation region in the semiconductor material between the first and second contact regions, forming a first electrical contact on the first contact region, and forming a second electrical contact on the second contact region.

An advantage of the present invention is that the electrostatic discharge protection device provides protection against electrostatic discharges for integrated circuit components. Another advantage of the present invention is that the electrostatic discharge protection device adds only a small amount of parasitic capacitance to I/O lines, which is particularly important in RF signal processing circuitry.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

The preferred embodiments of the present invention and their advantages are best understood by referring to FIGS. 1 through 4 of the drawings. Like numerals are used for like and corresponding parts of the various drawings.

Figure 1:
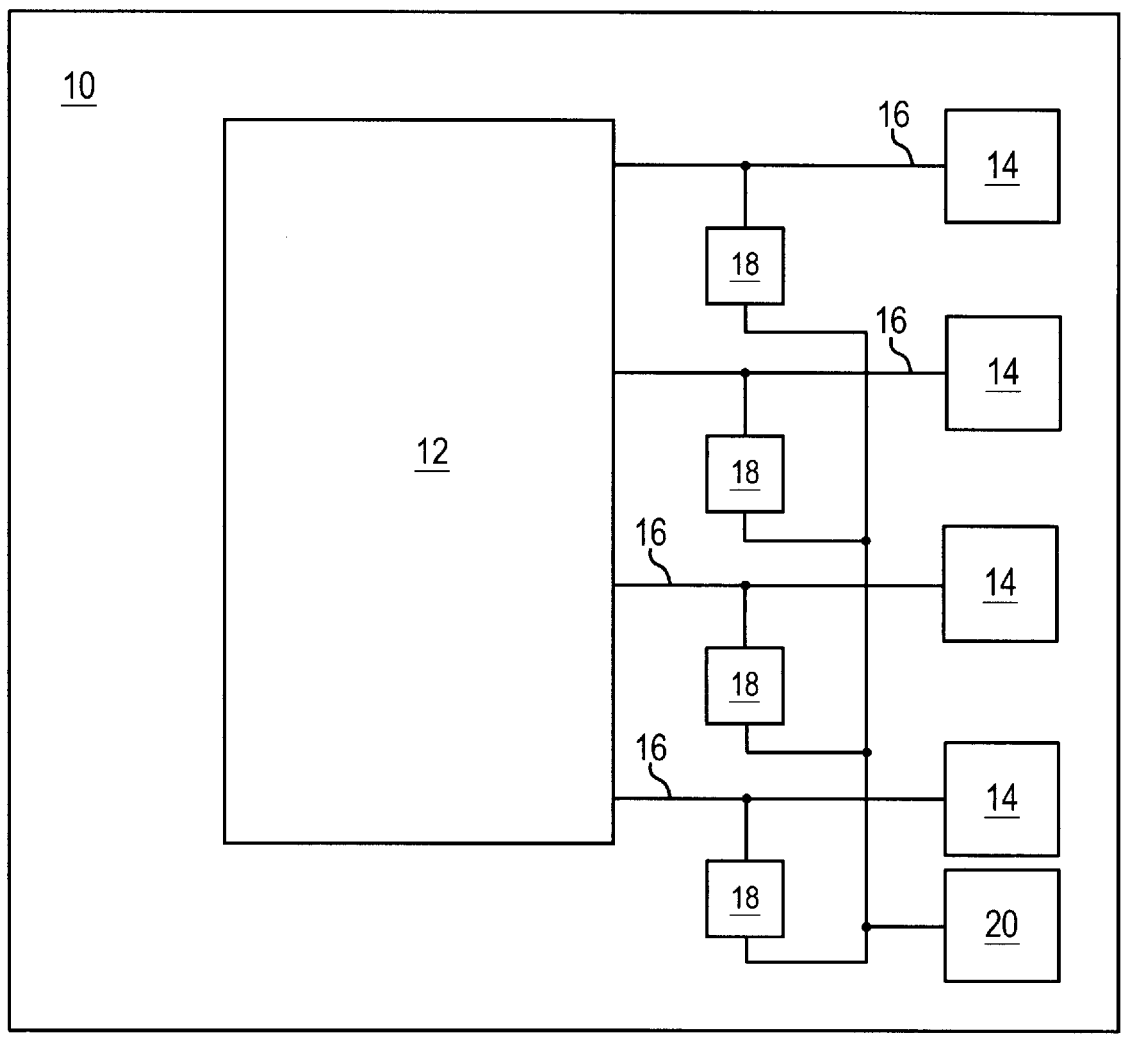
FIG. 1 is a block diagram of an integrated circuit chip constructed in accordance with the present invention.

Referring to FIG. 1, a block diagram of an integrated circuit chip 10 is shown. Integrated circuit chip 10 includes circuitry 12, which may be, for example, RF signal processing circuitry such as a low noise amplifier operating at 900 MHz. Circuitry 12 is connected to a set of I/O pads 14 by a set of I/O lines 16. I/O pads 14 may be connected to leads on an assembled chip package (not shown) by, for example, bond wires.

To prevent ESD pulses from being conducted from the leads to circuitry 12 by I/O lines 16, an ESD protection device 18 is connected to each I/O line 16. Each ESD protection device 18 may be physically located either near its respective I/O pad 14, as is conventional for ESD protection devices, or near circuitry 12. Each ESD protection device 18 is electrically connected between its respective I/O line 16 and a sink 20. It will be understood from the following description that sink 20 may be, for example, a local ground, an external ground, a power supply, or some other sink with sufficient capacity to absorb the level of charge and/or current contained in an electrostatic discharge of the type and magnitude for which protection of circuitry 12 is sought.

Figure 2A:
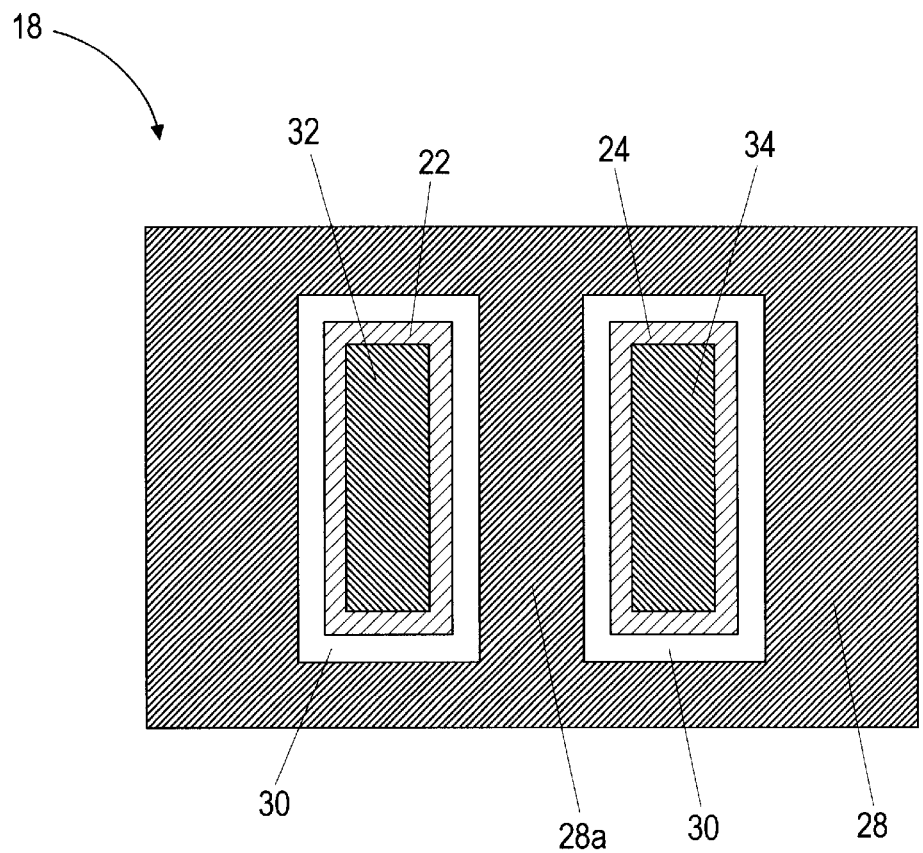
FIGS. 2A and 2B are a top view and a cross section, respectively, of an electrostatic discharge protection device in accordance with the present invention.
Figure 2B:
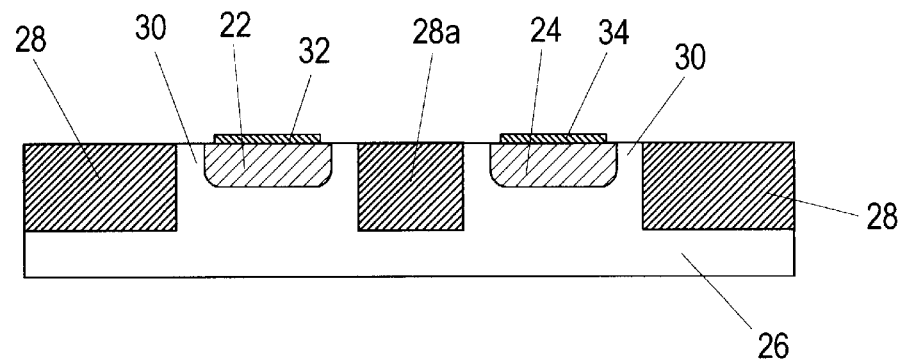

Referring to FIGS. 2A and 2B, an ESD protection device 18 is shown (not to scale) in top view and cross section, respectively. ESD protection device 18 has two contact regions 22 and 24 formed in the substrate 26 of integrated circuit chip 10. Contact regions 22 and 24 may comprise doped regions of the substrate 26, and may be similar to the source and drain regions formed in the fabrication of a transistor. In this example, each contact region 22, 24 measures approximately 100 μm in length (top to bottom in FIG. 2A) and approximately 2 to 3 μm in width (side to side in FIG. 2A).

An isolation region 28 formed in substrate 26 surrounds contact regions 22 and 24, creating an isolation area 28a approximately 2–5 μm wide between contact regions 22 and 24. Between each doped area 22, 24 and isolation region 28 is an undoped or lightly doped border region 30 of substrate 26. Each border region 30 forms a border approximately 0.5–4 μm wide around each contact region 22, 24.

Atop each contact region 22, 24 is an electrical contact 32, 34, respectively. Each electrical contact 32, 34 covers most of the surface of its respective contact region 22, 24, leaving only a border region of each contact region 22, 24 uncovered. In this example, the border region is approximately 0.5 μm wide. Electrical contact 32 may be electrically connected to an I/O line 16, while electrical contact 34 may be electrically connected to sink 20, or vice versa. The electrical connections to electrical contacts 32 and 34 may be made using conventional metallization techniques.

Figure 3A:
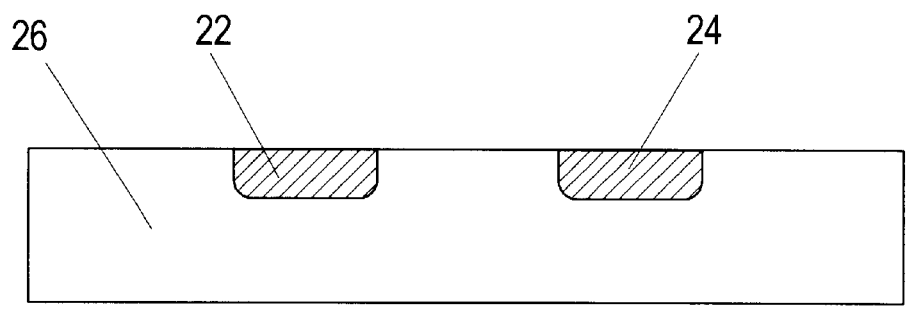
FIGS. 3A, 3B and 3C are cross sections of the electrostatic discharge protection device at various stages of fabrication.
Figure 3B:
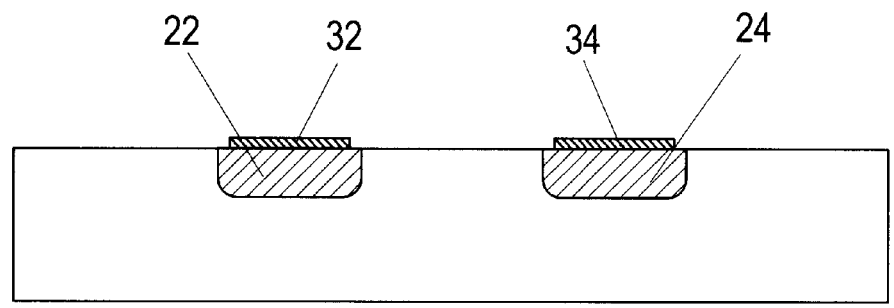
Figure 3C:
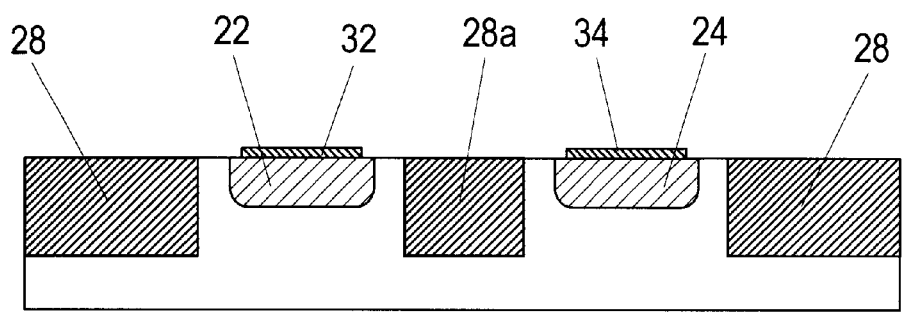

Referring to FIGS. 3A through 3C, a series of cross sections illustrating the formation of an ESD protection device 18 is shown. First, substrate 26 is formed from a compound semiconductor material such a gallium arsenide. For example, substrate 26 may be a commercially available, undoped, liquid-encapsulated Czochralski (LEC) material. Other substrate materials may also be used, including other compound semiconductors such as indium phosphide and gallium nitride. Substrate 26 may also be formed by other methods such as the vertical Bridgeman method or the vertical gradient freeze method.

Contact regions 22 and 24 are then formed, for example by ion implantation into substrate 26. Contact regions 22 and 24 may be N+ doped regions. Contact regions 22 and 24 may be formed by implantation of, for example, $Si29^+$ isotope using an acceleration energy of 150 keV and a dose of $3\times10^{13}$ ions/cm$^2$. These ions may be implanted through a plasma-deposited silicon dioxide layer of approximately 400 angstroms to form contact regions 22 and 24 with a depth of 0.5 $\mu$m. Contact regions 22 and 24 may then be annealed using, for example, a rapid thermal anneal under hydrogen ambient at approximately 900° C. The resulting sheet resistance of contact regions 22 and 24 is 100–200 ohms/square, although this value is not critical so long as the anticipated voltage drop across each contact region 22, 24 is small relative to the turn-on potential of ESD protection device 18. Epitaxial growth of an N+ layer may alternatively be used to form contact regions 22, 24.

Referring to FIG. 3B, electrical contacts 32, 34 are ohmic contacts formed of, for example, a suitable metallic alloy. As an example, electrical contacts 32, 34 may comprise an alloy of gold, germanium and nickel deposited using standard metallization techniques. In this example, a layer of 500 angstroms of germanium is deposited, followed by 1000 angstroms of gold, 400 angstroms of nickel and another 200 angstroms of gold. These metals may then be alloyed in an atmospheric ambient at approximately 420° C. for one minute. While a specific example is provided, it will be understood that various conventional contact metallization methods may be used.

The resistance of electrical contacts 32, 34 may be approximately 100 to 400 ohm-$\mu$m, although this value is not critical to the operation of device 18 so long as ohmic behavior is achieved. In this example, each electrical contact 32, 34 covers a central region of the respective contact region 22, 24, leaving a border area of the contact region 22, 24, measuring approximately 0.5 $\mu$m in width, uncovered by the electrical contact 32, 34.

Referring to FIG. 3C, Isolation region 28 is formed by ion implantation of one or more species of ions at energies up to, for example, 400 keV, with a penetration depth of, for example, approximately 0.5 $\mu$m. This implantation causes ion damage that drastically reduces carrier mobility in isolation region 28. This implantation also provides carrier trapping sites for recombination during an electrostatic discharge and effectively deactivates any doping in the isolation region 28. Although a penetration depth of 0.5 $\mu$m may be used, it will be understood that implant damage will occur at levels significantly deeper than the ion penetration depth, due to knock-on effects. Other isolation methods such as oxygen implantation with an anneal cycle may also be used.

In this example, isolation area 28a between contact regions 22 and 24 has a width of approximately 3 $\mu$m. Contact regions 22 and 24 are each separated from the respective edge of isolation area 28a by an undoped or lightly doped area approximately one-half micron to one micron in width.

The various processes described above may be carried out using standard lithographic techniques, such as I-line optical lithography. Other lithographic techniques such as gline or deep ultraviolet optical lithography, x-ray lithography or electron beam lithography may also be used.

The operation of ESD protection device 18, as presently understood, will now be described. When an ESD pulse occurs on an I/O line 16, an electric field rises rapidly between contact regions 22 and 24 since one contact region is electrically coupled to the I/O line 16 in question while the other contact region is electrically connected to sink 20. As this electric field rises, dipole regions form due to the different resistances or carrier mobilities between isolation region 28a and the undamaged regions 30 surrounding contact regions 22 and 24. These dipole regions allow the generation of a current controlled differential negative resistance, as well as creating impact ionization effects due to the locally high electric fields. As the electric field rises, injected carriers from contact regions 22 and 24 gain sufficient energy to generate a cascade of additional carriers by impact ionization. This large carrier generation rate then exceeds the recombination rate in isolation region 28a. In the area of substrate 26 directly underneath isolation region 28a, other avalanche multiplication processes take place where residual donors are ionized, also reducing the resistivity to support enhanced conduction. The above-described processes cause ESD protection device 18 to function as an effective current shunt, redirecting the ESD-originated current into regions of the device where it cannot cause damage.

Figure 4:
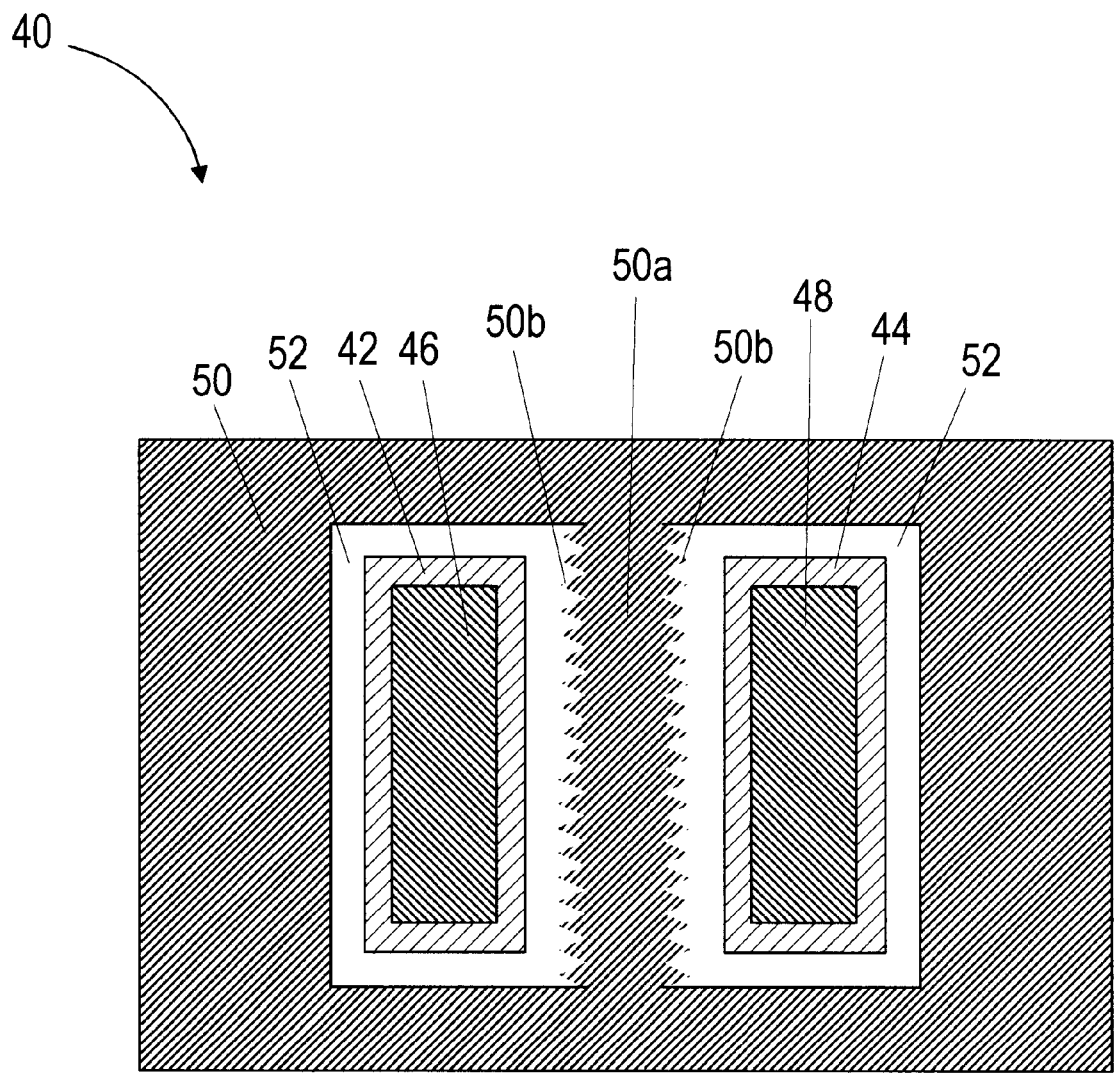
FIG. 4 is a top view of an alternative embodiment of the electrostatic discharge protection device.

Referring to FIG. 4, a top view of an ESD protection device 40 using an alternative design is shown. Device 40 has contact regions 42 and 44, which may be similar to the previously-described contact regions 22 and 24 of ESD protection device 18. Device 40 also has electrical contacts 46 and 48 atop contact regions 42 and 44. Electrical contacts 46 and 48 may be similar to the previously-described electrical contacts 32 and 34 of ESD protection device 18.

An isolation region 50 surrounds contact regions 46 and 48, leaving an undoped or lightly doped border 52 around each contact region 46, 48. Isolation region 50 may be similar to isolation region 28 of ESD protection device 18, with the following exception: the isolation region 50a between contact regions 46 and 48 has serrated edges 50b facing each contact region 46, 48. Edges 50b may comprise adjacent equilateral triangles measuring approximately 1–2 $\mu$m on each side. The outward-projecting vertices of these triangles may be separated by approximately 0.5–$\mu$m from the corresponding contact region 42, 44. Each triangle on one edge 50b of isolation region 50a is aligned with a corresponding triangle on the opposite edge 50b. These triangles serve to enhance the electric field in the vicinity of the triangle vertices during an electrostatic discharge, thereby lowering the "turn on" or threshold voltage of device 40.

Generally, device 40 may be created using the steps set forth above for device 18. However, the implant mask used for the formation of isolation region 50 may have limited definition. That is, the degree of precision with which the implant mask can be formed may be too low to allow precise formation of the triangles that form edges 50b of isolation region 50a. Thus, triangles with somewhat flattened vertices projecting toward contact regions 42 and 44 may result, and indeed may be preferable.

The ESD protection devices described herein have been found to give protection against electrostatic discharges in excess of 1000 volts. The amount of parasitic capacitance introduced by these devices has been measured at approximately 15 fF. Thus, these ESD protection devices represent a significant improvement over conventional ESD protection circuits, which introduce a much higher level of capacitance.

Although the present invention and its advantages have been described in detail, it should be understood that various changes, substitutions, and alterations can be made therein without departing from the spirit and scope of the invention as defined by the appended claims.

We claim:

1. An electrostatic discharge protection device for reducing electrostatic discharge spikes on a signal line, the device comprising:

first and second contact regions formed in a semiconductor material:

a first terminal electrically coupled to the signal line, the first terminal being in electrical contact with the first contact region;

a second terminal electrically coupled to a sink, the second terminal being in electrical contact with the second contact region; and an implant-damaged isolation region formed in the semiconductor material between the first and second contact regions.

2. The electrostatic discharge protection device of claim 1, wherein the semiconductor material comprises a compound semiconductor substrate.

3. The electrostatic discharge protection device of claim 2, wherein the compound semiconductor substrate comprises GaAs.

4. The electrostatic discharge protection device of claim 2, further comprising a first substrate region surrounding the first contact region, the first substrate region having a dopant concentration less than a dopant concentration of the first contact region.

5. The electrostatic discharge protection device of claim 4, further comprising a second substrate region surrounding the second contact region, the second substrate region having a dopant concentration less than a dopant concentration of the second contact region.

6. The electrostatic discharge protection device of claim 5, further comprising an implant-damaged isolation region formed in the semiconductor substrate surrounding the first and second substrate regions.

7. The electrostatic discharge protection device of claim 1, wherein the semiconductor material comprises a semi-insulating semiconductor substrate.

8. The electrostatic discharge protection device of claim 1, wherein the first and second contact regions comprise n-doped regions.

9. The electrostatic discharge protection device of claim 1, wherein the first and second contact regions comprise p-doped regions.

10. The electrostatic discharge protection device of claim 1, wherein the sink comprises an electrical ground.

11. An integrated circuit chip comprising:

a semiconductor substrate;

an integrated circuit having a plurality of integrated circuit components formed on the semiconductor substrate;

an I/O pad formed on a surface of the integrated circuit chip;

an I/O line connected between the I/O pad and at least one of the integrated circuit components, the I/O line being operable to conduct signals between the I/O pad and the at least one integrated circuit component; and an electrostatic discharge device for reducing electrostatic discharge spikes on the I/O line, the electrostatic discharge device having:

first and second doped regions formed in the semiconductor substrate;

a first terminal electrically coupled to the I/O line, the first terminal being in electrical contact with the first doped region;

a second terminal electrically coupled to a sink, the second terminal being in electrical contact with the second doped region; and an implant-damaged isolation region formed in the semiconductor substrate between the first and second doped regions.

12. The integrated circuit chip of claim 11, wherein the semiconductor substrate comprises a compound semiconductor substrate.

13. The integrated circuit chip of claim 12, wherein the compound semiconductor substrate comprises GaAs.

14. The integrated circuit chip of claim 11, wherein the semiconductor substrate comprises a semi-insulating semiconductor substrate.

15. An electrostatic discharge protection device for reducing electrostatic discharge spikes on a signal line, the device comprising:

first and second contact regions formed in a semiconductor material, each contact region comprising a doped region of the semiconductor material:

a first terminal for being electrically coupled to the signal line, the first terminal being in ohmic contact with the first contact region;

a second terminal for being electrically coupled to a sink, the second terminal being in ohmic contact with the second contact region;

an implant-damaged isolation region formed in the semiconductor material in between the first and second contact regions;

a first border region of the semiconductor material lying between the first contact region and the isolation region, the first border region being adjacent to the first contact region and adjacent to the isolation region;

a second border region of the semiconductor material lying between the second contact region and the isolation region, the second border region being adjacent to the second contact region and adjacent to the isolation region.

16. The electrostatic discharge protection device of claim 15, wherein the first and second border regions each comprise an undoped region of the semiconductor material.

* * * * *